US008482920B2

(12) United States Patent
Tissot et al.

(10) Patent No.: US 8,482,920 B2
(45) Date of Patent: Jul. 9, 2013

(54) DEVICE FOR COOLING AN ELECTRONIC CARD BY CONDUCTION COMPRISING HEAT PIPES, AND CORRESPONDING METHOD OF FABRICATION

(75) Inventors: Serge Tissot, Hyeres (FR); Thierry Demonchaux, Hyeres (FR); Philippe Oconte, Rocbaron (FR); Guy Vanneuville, Pierrefeu du Var (FR)

(73) Assignee: Thales, Neuilly sur Seine (FR)

( * ) Notice: Subject to any disclaimer, the term of this patent is extended or adjusted under 35 U.S.C. 154(b) by 130 days.

(21) Appl. No.: 12/809,281

(22) PCT Filed: Dec. 18, 2008

(86) PCT No.: PCT/EP2008/067929
§ 371 (c)(1),
(2), (4) Date: Feb. 22, 2011

(87) PCT Pub. No.: WO2009/077601
PCT Pub. Date: Jun. 25, 2009

(65) Prior Publication Data
US 2011/0182033 A1 Jul. 28, 2011

(30) Foreign Application Priority Data
Dec. 18, 2007 (FR) ...................................... 07 08833

(51) Int. Cl.
*H05K 7/20* (2006.01)
(52) U.S. Cl.
USPC ............................ 361/700; 361/696; 361/720
(58) Field of Classification Search
USPC ................ 361/700, 720, 679.52, 679.54, 722
See application file for complete search history.

(56) References Cited

U.S. PATENT DOCUMENTS

| 5,036,428 | A | * | 7/1991 | Brownhill et al. | 361/721 |
| 5,646,826 | A | * | 7/1997 | Katchmar | 361/704 |
| 6,839,235 | B2 | | 1/2005 | St. Louis et al. | |
| 7,298,623 | B1 | * | 11/2007 | Kuczynski et al. | 361/719 |
| 7,613,001 | B1 | * | 11/2009 | Liu et al. | 361/700 |

(Continued)

FOREIGN PATENT DOCUMENTS
EP 1853097 11/2007

OTHER PUBLICATIONS

"IEEE Standard for Mechanical Core Specifications for Conduction-Cooled Eurocards", IEEE Computer Society of The Institute of Electrical and Electronics Engineers, Inc., Aug. 26, 1992, 17 pages, vol. 1101.2-1992, The Institute of Electrical and Electronic Engineers, Inc., New York, USA.

*Primary Examiner* — Adrian S Wilson
*Assistant Examiner* — Abhishek Rathod
(74) *Attorney, Agent, or Firm* — Baker Hostetler LLP

(57) ABSTRACT

In a device for cooling an electronic circuit board comprising at least one component covered with an exchanger cover, the device includes a heat sink covering all or some of the electronic circuit board, and at least one heat pipe per component, each heat pipe being capable of carrying away the heat from the component with which it is associated to at least one end of the electronic circuit board via a zone of the heat pipe called the condensing zone. The device further includes at least one heat-exchange part located on the end of the electronic circuit board and mounted freely on the heat sink, each heat pipe being attached to the heat-exchange part by means of its condensing zone.

11 Claims, 7 Drawing Sheets

SECTION B-B

U.S. PATENT DOCUMENTS

| | | | |
|---|---|---|---|
| 7,719,831 B2 * | 5/2010 | Fujiwara | 361/679.47 |
| 7,859,837 B2 * | 12/2010 | Nemoz et al. | 361/690 |
| 8,223,494 B2 * | 7/2012 | Bult | 361/700 |
| 2003/0128508 A1 | 7/2003 | Faneuf et al. | |
| 2003/0189815 A1 * | 10/2003 | Lee | 361/719 |
| 2004/0120116 A1 | 6/2004 | St. Louis et al. | |
| 2005/0122686 A1 | 6/2005 | Oyamada | |
| 2007/0171616 A1 | 7/2007 | Peng et al. | |
| 2008/0007914 A1 * | 1/2008 | Peng et al. | 361/700 |
| 2009/0273904 A1 * | 11/2009 | Chung et al. | 361/700 |

* cited by examiner

SECTION A-A

DETAIL A

SECTION B-B

SECTION C-C

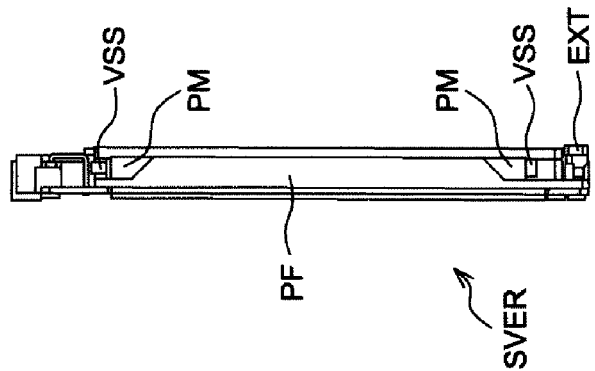
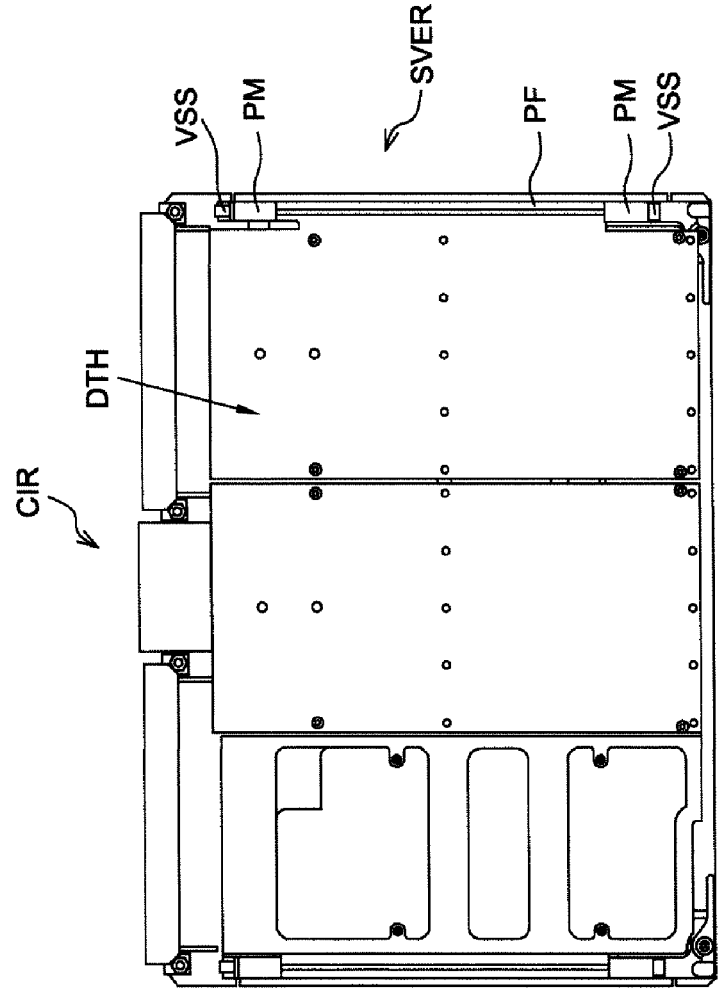
FIG.3b
FIG.3a

SECTION E-E

DETAIL B

SECTION D-D

DETAIL C

DEVICE FOR COOLING AN ELECTRONIC CARD BY CONDUCTION COMPRISING HEAT PIPES, AND CORRESPONDING METHOD OF FABRICATION

CROSS-REFERENCE TO RELATED APPLICATIONS

This application is a National Stage of International patent application PCT/EP2008/067929, filed on Dec. 18, 2008, which claims priority to foreign French patent application No. FR 07 08833, filed on Dec. 18, 2007, the disclosures of which are incorporated by reference in their entirety.

FIELD OF THE INVENTION

The invention relates to the cooling of electronic circuit boards, in particular the cooling of electronic circuit boards by conduction. This cooling method consists in carrying away the heat from the electronic circuit board directly to another body in contact with itself.

BACKGROUND OF THE INVENTION

Various elements can be used to cool an electronic circuit board and its components. For example, it is possible to attach a heat sink to all or some of the electronic circuit board so as to carry away the heat produced by the board to the outside like the frame in which the electronic circuit board can be fitted.

Any electronic circuit board comprises spots that have a higher temperature than the rest of the board. These hot spots correspond to the places containing certain components, for example processors. In order to improve the dispersal of the heat from these hot spots, it is possible to use heat pipes. The latter are long metal cylinders (for example made of copper or aluminum) containing a fluid such as water.

This water is in equilibrium between its gaseous phase and its liquid phase, in the absence of any other gas. In the portion of the heat pipe situated close to the component to be cooled, the water heats up and vaporizes while absorbing energy originating from the heat emitted by this component.

This gas then rises up the heat pipe to arrive close to a cooling system where it will be cooled, until it condenses in order to become liquid again, and give up energy to the ambient air in the form of heat.

An example of a solution incorporating a heat pipe is described in document U.S. Pat. No. 6,839,235. It is shown as a heat pipe/heat sink assembly where each heat pipe is attached to one end of the heat sink with the aid of a tin weld or else a thermally conductive adhesive. This attachment between the heat pipes and the heat sink brings about a dependency between the two elements both from the thermal and the mechanical viewpoint.

The thermal dependence involves a poor clearance of the heat from the components of the electronic circuit board. Specifically, the calories carried away from the hot spots are added to the calories of the other components of the electronic circuit board, the latter being carried away via the heat sink. This thermal dependence greatly slows down the carrying away of the heat.

The mechanical dependence between the sink and the heat pipes makes mass fabrication of the cooling device difficult because of a necessary attachment between the heat pipes and the heat sink.

SUMMARY OF THE INVENTION

The object of the invention is to provide a solution to these problems.

One object of the invention is to propose a cooling device making it possible to improve the carrying away of heat from the hot spots of an electronic circuit board.

Another object of the invention is to propose a method of fabricating such a cooling device.

Accordingly, the proposal is for a device for cooling an electronic circuit board comprising at least one component covered with a protective cover, the device comprising a heat sink covering all or some of the electronic circuit board, and at least one heat pipe per component, each heat pipe being capable of carrying away the heat from the component with which it is associated to at least one end of the electronic circuit board via a zone of the heat pipe called the condensing zone.

According to a general feature of this aspect, said device comprises at least one heat-exchange part located on said end of the electronic circuit board and mounted freely on the heat sink, each heat pipe being attached to the heat-exchange part by means of its condensing zone.

In other words, the ends of the heat pipes are held at the ends of the electronic circuit board by means of a heat-exchange part. No heat pipe is therefore attached to the heat sink.

This independence between the heat sink and the heat pipe(s) allows the heat to be better carried away from the components of the electronic circuit board, these components usually being the hottest spots of the electronic circuit board. Specifically, by virtue of the proposed device, the mixing of the calories originating on the one hand from the components (calories carried away by the heat pipes) and, on the other hand, from the rest of the electronic circuit board (calories carried away by the heat sink) is limited.

For example, the heat-exchange part can be mounted on the heat sink with the aid of pads.

According to one embodiment, the heat-exchange part and the portion of the heat sink that it covers can form a heat slide capable of being inserted into a guide rail mounted on a frame external to the circuit board.

Preferably, a locking system can be mounted on each heat slide, each locking system being divided into at least one fixed portion and at least one movable portion, said fixed portions being formed from the heat sink.

Preferably, each component is associated with at least two heat pipes distributed on either side of the component.

For example, each component may be associated with at least two heat pipes placed on the same side of the component.

For example, at least two heat pipes associated with one and the same component are oriented in two opposite directions on a first axis.

Preferably, at least two heat pipes associated with one and the same component each comprise an L-shaped deformation, one branch of the L being substantially parallel to the end of the electronic circuit board where the heat-exchange part is located, the curves of the deformation of each heat pipe being oriented in two opposite directions on a second axis, parallel to said end of the electronic circuit board.

More precisely, at least two heat pipes associated with one and the same component have a U-shaped deformation, the branches of each U being substantially parallel to the end of the electronic circuit board where the heat-exchange part is located, the deformations of the heat pipes being oriented in two opposite directions on a second axis, parallel to said end of the electronic circuit board.

Preferably, each exchanger cover is attached to the heat sink with the aid of n screws, and is held at a chosen and fixed distance from the component with which it is associated with the aid of k check screws, n and k being whole numbers.

According to another aspect, an electronic circuit incorporating an electronic circuit board associated with a cooling device as described above is proposed.

According to another aspect, a method for fabricating a cooling device as mentioned above is proposed.

According to a general feature of this other aspect, it comprises a step of fabricating the heat sink and a step of fabricating the heat pipes, independent of the step of fabricating the heat sink, then a step of integrating the cooling device into the electronic circuit comprising an attachment of the heat sink to the electronic circuit board and an assembly of the heat sink, the heat pipes and the protective caps.

According to one embodiment, the assembly of the heat sink, the heat pipes and the protective caps comprises, for each component of said assembly, a mounting of the exchanger cover of the component in question onto the heat sink, the mounting comprising, for each component:

- a placement of a spacer on said component, the spacer having a chosen and fixed height corresponding to said distance at which the exchanger cover is held away from the component,
- a placement of the exchanger cover onto the corresponding component, the spacer being inserted between the component and the corresponding exchanger cover,
- a first screwing of the n screws, said screws passing through the exchanger cover and a portion of the thickness of the heat sink,
- a screwing of the k check screws, said check screws passing through the exchanger cover and resting on the heat sink,
- an unscrewing of the n screws and then a removal of the exchanger cover and of the spacer,
- a deposition of a layer of thermal agent over the component,
- a new placement of the exchanger cover over the component, the thermal agent being inserted between the component and the corresponding exchanger cover,
- a second screwing of the n screws, tighter than the first screwing, the k check screws holding the exchanger cover at said chosen and fixed distance from the component.

According to a new aspect, the proposal is for a device for cooling an electronic circuit board comprising at least one component covered with a protective cover, the device comprising a heat sink covering all or some of the electronic circuit board, and at least one heat pipe per component, each heat pipe being capable of carrying away the heat from the component with which it is associated to at least one end of the electronic circuit board via a zone of the heat pipe called the condensing zone. Said device comprises at least one heat-exchange part located on said end of the electronic circuit board and mounted on the heat sink, by means of its condensing zone.

The cooling device according to this new aspect may comprise a locking system mounted on each heat slide, each locking system being divided into at least one fixed portion and at least one movable portion, said fixed portions being formed from the heat sink.

The cooling device according to this new aspect may comprise at least two heat pipes associated with one and the same component each comprising an L-shaped deformation, one branch of the L being substantially parallel to the end of the electronic circuit board where the heat-exchange part is located, the curves of the deformation of each heat pipe being oriented in two opposite directions on a second axis, parallel to said end of the electronic circuit board.

More precisely, the cooling device according to this new aspect may comprise at least two heat pipes associated with one and the same component comprising a U-shaped deformation, the branches of each U being substantially parallel to the end of the electronic circuit board where the heat-exchange part is located, the deformations of the heat pipes being oriented in two opposite directions on a second axis, parallel to said end of the electronic circuit board.

According to this new aspect, each exchanger cover is attached to the heat sink with the aid of n screws and is held at a chosen and fixed distance from the component with which it is associated with the aid of k check screws, n and k being whole numbers.

Also proposed is a method for fabricating a cooling device according to this new aspect. It comprises a step of fabricating the heat sink and the heat pipes, then a step of integrating the cooling device within the electronic circuit comprising an assembly of the heat sink, the heat pipes and the protective caps. This assembly of the heat sink, the heat pipes and the protective caps may comprise, for each component of said assembly, a mounting of the exchanger cover of the component in question onto the heat sink, the mounting comprising, for each component:

- a placement of a spacer on said component, the spacer having a chosen and fixed height corresponding to said distance at which the exchanger cover is held away from the component,
- a placement of the exchanger cover onto the corresponding component, the spacer being inserted between the component and the corresponding exchanger cover,
- a first screwing of the n screws, said screws passing through the exchanger cover and a portion of the thickness of the heat sink,
- a screwing of the k check screws, said check screws passing through the exchanger cover and resting on the heat sink,
- an unscrewing of the n screws and then a removal of the exchanger cover and of the spacer,
- a deposition of a layer of thermal agent over the component,
- a new placement of the exchanger cover over the component, the thermal agent being inserted between the component and the corresponding exchanger cover,
- a second screwing of the n screws, tighter than the first screwing, the k check screws holding the exchanger cover at said chosen and fixed distance from the component.

BRIEF DESCRIPTION OF THE DRAWINGS

Other advantages and features of the invention will appear on examination of the detailed description of embodiments of the invention and of an application of a fabrication method of the invention, these being in no way limiting, and of the appended drawings in which:

FIGS. 3a and 3b represent in greater detail an example of the locking system mounted on the slides of the electronic circuit board;

DETAILED DESCRIPTION

Figures 1, 2A:
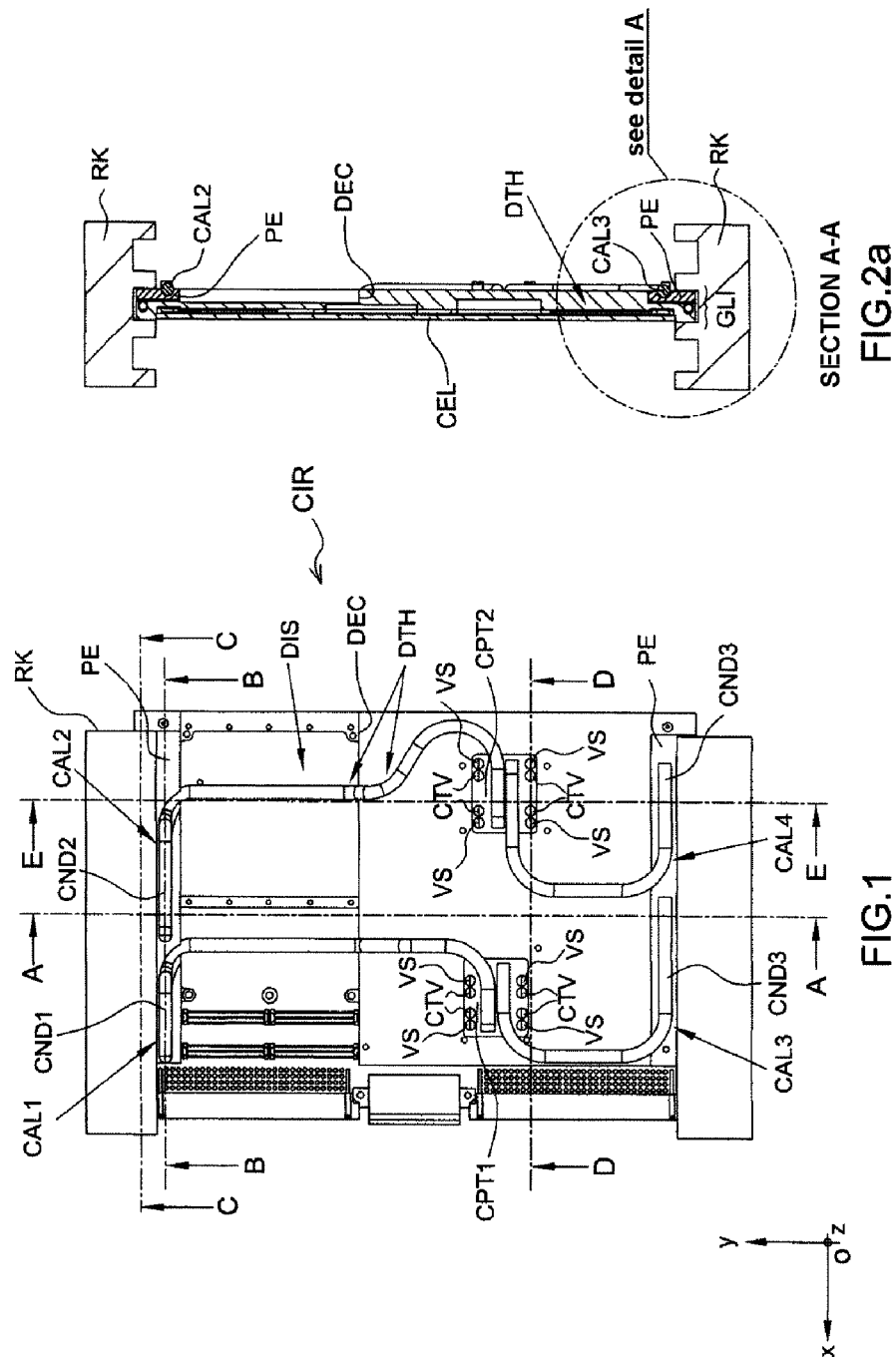
FIG. 1 represents an electronic circuit board furnished with a cooling device, seen from above.
FIGS. 2a to 2d represent views in section, on various axes of the board illustrated in FIG. 1, and in particular, the slide zone at the ends of the electronic circuit board.

Reference is now made to FIG. 1 and to FIG. 2a which illustrates a section of the circuit represented in FIG. 1.

This FIG. 1 shows an electronic circuit CIR furnished with a board cooling device DIS. The latter comprises an electronic circuit board CEL (visible in the section 2a).

Placed on the electronic circuit board CEL is a heat sink DTH. In this example, the heat sink DTH covers all of the electronic circuit board CEL, but has a crank DEC where its thickness varies (as illustrated in FIG. 2a).

In certain places of the heat sink DTH, protective caps CPT1, CPT2 are inlaid. The latter cover electronic components placed on the electronic circuit board CEL. The protective caps CPT1, CPT2 are heat-diffusing elements. Accordingly, they are made of an appropriate material, for example copper.

The function of each exchanger cap CPT1, CPT2 is to capture the calories generated by the component above which it is placed and to diffuse them to heat pipes. This architecture makes it possible to more rapidly cool the heat of the components (for example the processors) of the electronic circuit board, which are considered to be hot spots. Specifically, taking the example of an electronic circuit board comprising two processors, and dissipating in total a power of 80 W, 42 W (that is more than half) originate from the two processors (2*21 W).

Each exchanger cover CPT1, CPT2 is attached to the heat sink DTH with the aid of n screws VS, in this instance n is equal to 4. Moreover, k check screws CTV (in this instance k is equal to 4) are placed on each exchanger cover CPT1, CPT2. The role of these check screws CTV is described in greater detail below.

In order to carry away the heat captured by the protective caps CPT1, CPT2, heat pipes connect them to the ends of the electronic circuit board CEL. In this example, two heat pipes are associated with each component via its protective cover, each of the heat pipes being connected to one of the ends of the electronic circuit board.

The two heat pipes referenced CAL1 and CAL3 make it possible to carry away the heat from the component placed beneath the exchanger cover CPT1, and the two heat pipes referenced CAL2 and CAL4 make it possible to carry away the heat from the component placed beneath the exchanger cover CPT2. Each heat pipe CAL1, CAL2, CAL3 and CAL4 comprises, at its end other than that placed above the component, a condensing zone respectively CND1, CND2, CND3 and CND4. These condensing zones CND1, CND2, CND3 and CND4 are attached to a heat-exchange part PE. As shown in FIG. 1, the heat pipes CAL1, CAL2, CAL3 and CAL4 travel (without being attached) in grooves arranged in the heat sink DTH of the exchanger cover CPT1, CPT2 as far as the corresponding heat-exchange part PE, the part PE to which they are attached by means of their condensing zone CND1, CND2, CND3 and CND4.

In this figure, one heat-exchange part PE is placed at each end of the electronic circuit board CEL. More precisely, it is mounted freely on the heat sink DTH. For example, the heat-exchange part can be simply guided by pads PLT shown in FIG. 2c. The dimensions of these pads PLT are much smaller than those of the heat-exchange part PE and of the heat sink DTH. Consequently, the exchange of calories between these two elements is negligible relative to the other heat transfers taking place between the electronic circuit board CEL and its cooling device DIS.

It is therefore totally independent of the heat sink DTH (mechanically) and of the electronic circuit board CEL.

More generally, it is possible to associate only one heat pipe per component (as described for example in document U.S. Pat. No. 6,839,235), or in contrast at least two heat pipes per component.

In another embodiment, it is possible to replace each heat pipe CAL1, CAL2, CAL3 and CAL4, with two heat pipes in parallel but having a thinner diameter than each of the heat pipes shown in FIG. 1. Doubling the heat pipes makes it possible to increase the reliability of the cooling device DIS. Specifically, if one of the heat pipes fails or deteriorates, the heat pipe placed parallel to the defective heat pipe carries away the heat from the component to one of the edges of the electronic circuit board.

It is of particular value to orient the two heat pipes associated with one and the same component in two opposite directions (+Y/−Y in this example) so as to improve the effectiveness of the heat pipes. Specifically, the effectiveness of the heat pipes (sintered or other pipes) depends on gravity (or acceleration). The manner in which the electronic circuit CIR is positioned may have an influence on the operation of the heat pipes.

Orienting the heat pipes of one and the same circuit in different positions ensures that, irrespective of the position of the circuit, at least one heat pipe always operates in an optimal manner irrespective of the effect of acceleration or gravity.

Moreover, because of their deformations oriented in two opposite directions, the heat pipes referenced CAL1 and CAL2 will be the most effective if the circuit sustains an acceleration in the direction O/+Y.

By contrast, if the circuit sustains an acceleration on the axis O/−Y, it will be the heat pipes referenced CAL3 and CAL4 that will be the most effective.

Therefore, it is of particular value to curve each heat pipe CAL1, CAL2, CAL3 and CAL4 in the shape of a U in order to improve the effectiveness of the latter should the electronic circuit CIR sustain an acceleration (more simply, it would also have been possible to curve the heat pipes in the shape of an L, without bending them over the component). In order to further increase the effectiveness of the heat pipes, it is preferable to curve the heat pipes starting from either side of one and the same component CAL1 and CAL3 on the one hand and CAL2 and CAL4 on the other hand, in opposite directions, on the axis X/−X in FIG. 1.

These various orientations of the heat pipes may be applied to a conventional cooling device (for example that described in document U.S. Pat. No. 6,839,235), that is to say without mechanical/thermal independence between the heat sink DHT and the heat pipes.

A description will now be given in greater detail of the edges of the electronic circuit board CEL, and the portion of the cooling device in this location. As can be seen in the section of FIG. 2a, the heat sink DTH extends under the heat-exchange part PE. Together they form a heat slide GLI.

The latter can be inserted into a corresponding card guide RK, made on a frame external to the electronic circuit CIR.

The card guide RK is in contact with the upper face of the heat-exchange part PE. Therefore, the heat of the components carried away by the heat pipes CAL1, CAL2, CAL3 and CAL4 is carried away in the direction of the upper contact of the heat slides GLI with the card guide RK.

By contrast, the heat originating from the other elements of the electronic circuit board CEL is carried away via the portion of the heat sink DTH forming the heat slide GLI, in other words the lower contact zone of the heat slide GLI with the card guide RK.

This distribution makes it possible to keep the paths of the calories separate and thus to prevent the rest of the electronic circuit board CEL from heating the hot spots and vice versa.

Figure 2B:
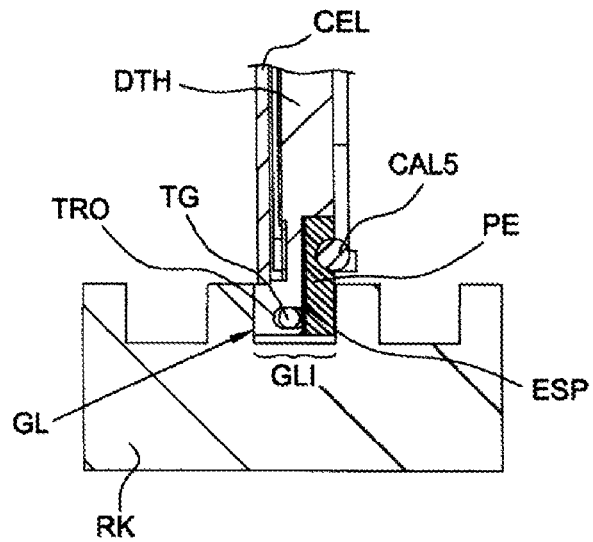
Figure 2C:
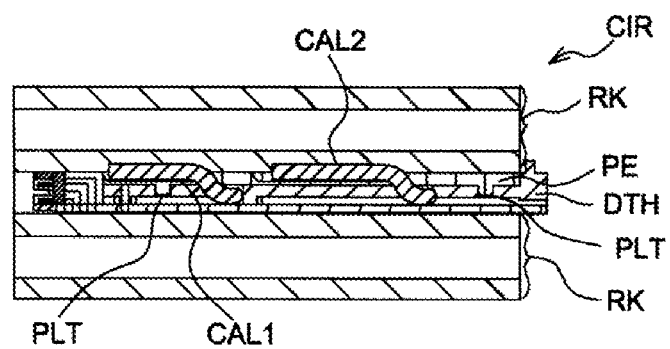
Figure 2D:
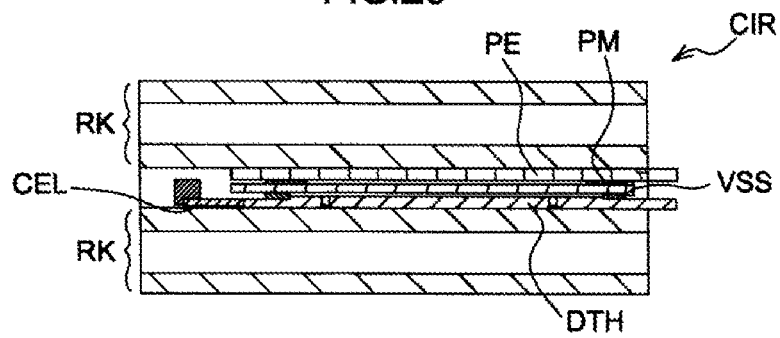

As illustrated in greater detail in FIG. 2b (DETAIL A), the portion of the heat sink DTH forming the heat slide GLI is pierced with an oblong hole TRO traversed by a rod TG. This hole TRO and the portion of the heat sink DTH forming the heat slide GLI form part of a locking system SVER. This locking system SVER makes it possible to secure the electronic circuit board and the card guide in which it has been slid, with the aid of clamping screws VSS that can be seen in FIG. 2d.

The locking system SVER is shown in greater detail in FIG. 3a and the corresponding sectional view 3b. This locking system SVER is formed of a fixed portion PF and of two movable portions PM mounted on the aforementioned rod TG, and immobilized with the aid of two clamping screws VSS. This locking system SVER mounted on slides is well known to those skilled in the art as a "wedgelock" or "cardlock". For example, document "IEEE Standard 1101.2 for Mechanical Core Specifications for Conduction-Cooled Eurocards" published in August 1992 describes a conventional "Wedgelock" system.

In the example illustrated in FIGS. 3a and 3b, the fixed portion PF of the locking system SVER is formed in line with the heat sink DTH. Integrating the fixed portion PF into the heat sink DTH improves the rigidity of the heat sink DTH and increases the cross section available for carrying away the calories. A further advantage of this is that it reduces the unusable zone for installing electronic components on the electronic circuit board CEL.

The inclusion of the fixed portion PF of the locking system SVER within the heat sink DTH can be carried out for a conventional cooling device compatible with IEEE Standard 1101.2.

Reference is again made to FIG. 2b. The rod TG moves on the axis X/–X inside the hole TRO so as to immobilize the heat slide GLI inside the recess of the rack RK. When the heat slide GLI is immobilized (as shown in FIG. 2b), a space ESP located between the heat-exchange part PE and the heat sink DTH is reduced to its minimal value. This space ESP widens when the heat slide GLI is removed from the guide rail RK.

Reference is now made to FIGS. 4a to 4d which illustrate more precisely the zone of the electronic circuit CIR in which a component CMP is situated.

Figure 4A:
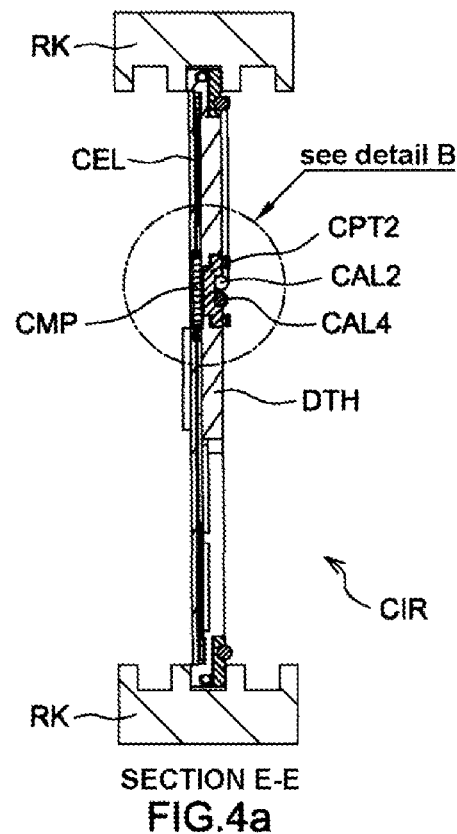
FIGS. 4a to 4d represent views in section, of the electronic circuit board shown in FIG. 1, and in particular a component placed on the electronic circuit board.
Figure 4B:
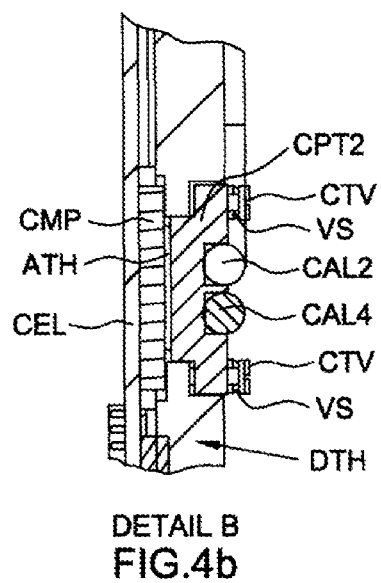

FIG. 4a is a view in section of the electronic circuit CIR on an axis E-E. The component CMP and more particularly the zone of contact between this component CMP and its exchanger cover CPT2 is visible in this section. This contact zone is shown in greater detail in FIG. 4b (DETAIL B). The exchanger cover CPT2 comprises two lateral fins which rest on the heat sink DTH. The attachment between the heat sink DTH and protective caps will be explained in greater detail below.

The central portion of the exchanger cover CPT2 rests on the component CMP and more precisely on a layer of thermal agent ATH deposited on the component CMP, on the zone above which the exchanger cover CPT2 is placed. This thermal agent ATH has considerable thermal conductivity in order to promote the carrying away of the heat from the component CMP to its exchanger cover CPT2. Moreover, as illustrated in DETAIL B, the heat pipes CAL2 and CAL4 are situated in grooves arranged in the exchanger cover CPT2. For example, the heat pipes CAL2, CAL4 can be soldered inside these grooves.

Figure 4C:
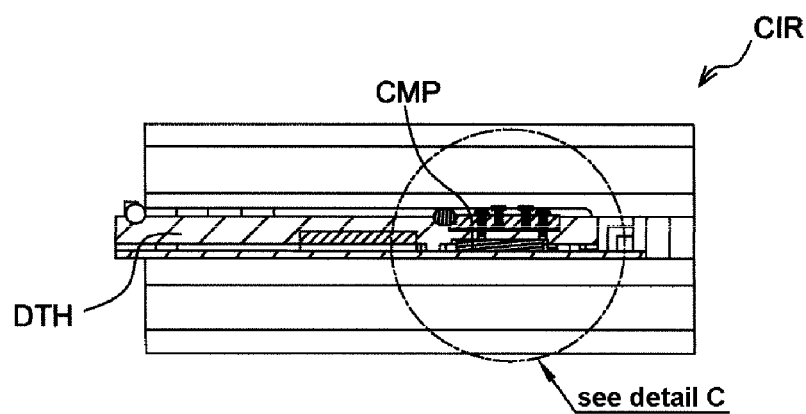

FIG. 4c illustrates another view in section of the electronic circuit CIR on an axis D-D. This FIG. 4c makes it possible to view more precisely how the exchanger cover CPT2 and the heat sink DTH are attached together. Naturally, this example can be reproduced on the other protective caps of the electronic circuit CIR.

Figure 4D:
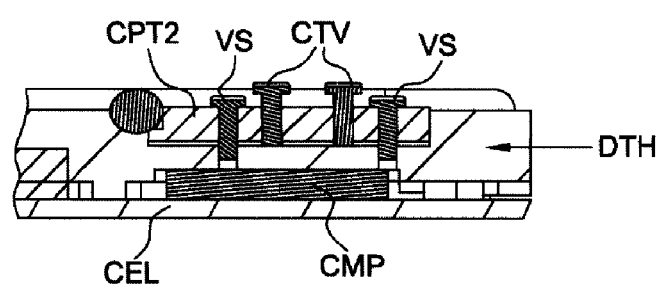

The contact zone between the heat sink DTH and the exchanger cover CPT2 is illustrated in greater detail in FIG. 4d (DETAIL C).

In this example, the exchanger cover CPT2 is traversed by 4 screws VS (two can be seen in FIG. 4d). These screws VS also traverse a portion of the heat sink DTH in order to attach the exchanger cover CPT2 and the heat sink DTH together.

Moreover, 4 check screws CTV (2 can be seen in FIG. 4d) make it possible to keep the exchanger cover CPT2 at a chosen distance from the component CMP. These check screws CTV traverse only the exchanger cover CPT2 and keep it at a chosen distance from the component CMP. This distance may for example be equal to 0.2 mm.

Figure 5:
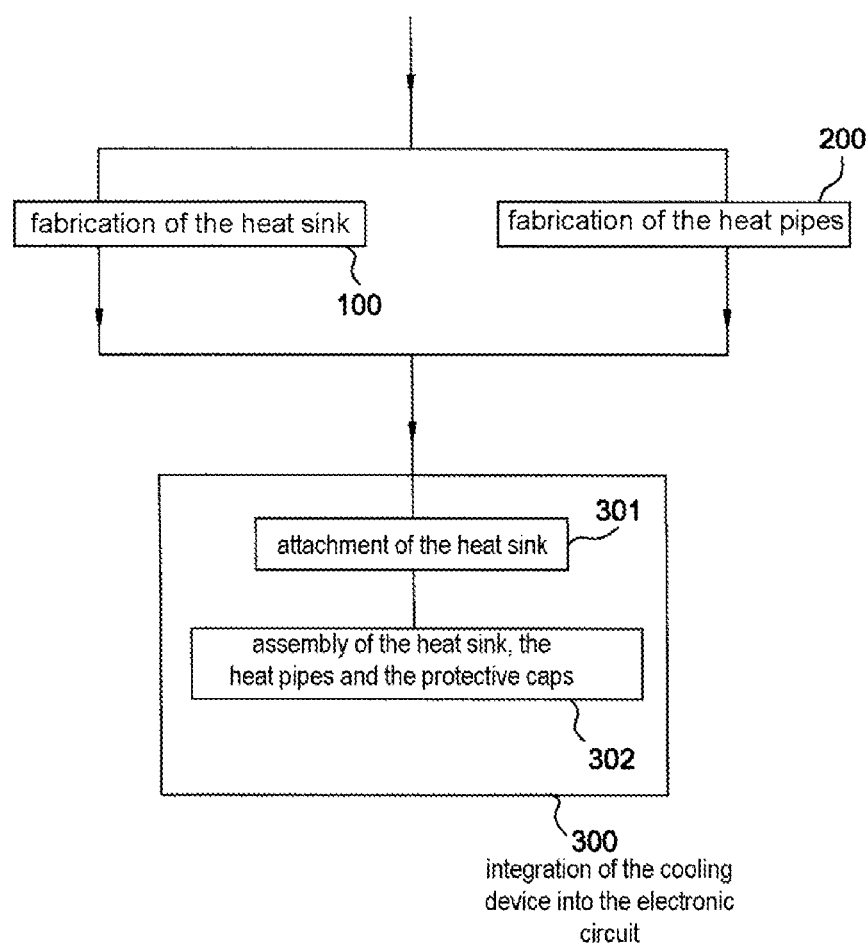
FIG. 5 represents an application of a method for fabricating a cooling device according to the invention.

Reference is now made to FIG. 5 which illustrates an embodiment of the method for fabricating the cooling device according to the invention.

This embodiment comprises in parallel a step 100 for fabricating the heat sink, and a step 200 for fabricating the heat pipes, independent of the step 100. The production cycles of the heat pipes on the one hand and of the heat sink on the other hand are therefore separate.

The cooling device is then integrated into the electronic circuit 300. During this step, the heat sink is attached to the electronic circuit board 301, then the heat sink, the heat pipes and the protective caps are assembled 302.

This embodiment has the advantage of making maintenance, repair and storage of the various elements forming the cooling device easier because notably of the separate production cycles of the heat pipes and the heat sink and because of the assembly of these elements only at the time of their integration into the electronic circuit board.

Figure 6:
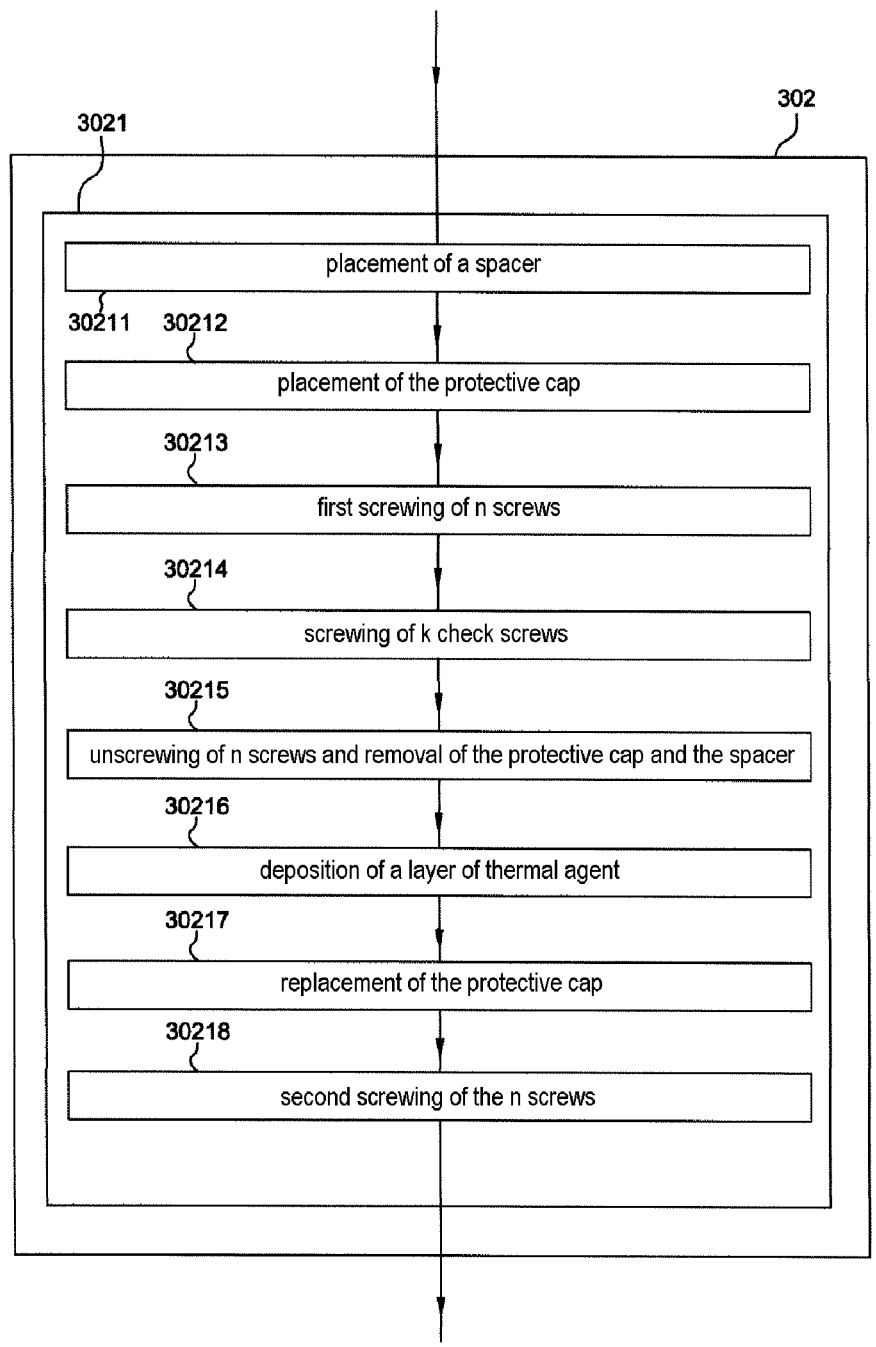
FIG. 6 illustrates in greater detail the step of assembling the heat sink, the heat pipes and the protective caps of the components.

FIG. 6 illustrates more precisely the assembly step 302, and in particular a step 3021 of placing the exchanger cover over the component on the heat sink.

The method of applying this step 3021 makes it possible to systematically place the exchanger cover at the chosen distance from the component. Specifically, in a conventional fabrication method, the exchanger cover is placed approximately at a certain distance from the component, the value of this distance varying more or less from one circuit to another and even from one component to another.

The method of applying this step 3021 taken in isolation can be applied to a conventional cooling device, for example that described in document U.S. Pat. No. 6,839,235.

The step 3021 comprises a first substep 30211 in which a spacer is placed above the component. The height of this spacer corresponds to the distance at which it is desired to place the cover from the component. This distance may for example be equal to 0.2 mm. The spacer may have a certain elasticity so as not to damage the component.

Then the exchanger cover is placed above this spacer 3022.

A first screwing of the exchanger cover onto the heat sink is carried out with the aid of n screws (4 in this example) 30213. This first screwing is preferably relatively light, the n screws having to be subsequently removed.

A screwing of k check screws 30214 (in this example k is equal to 4) is then carried out, the k check screws passing through the exchanger cover and resting on the heat sink in order to keep the exchanger cover at a distance, the height of the spacer, from the component.

The 4 screws are then unscrewed and the exchanger cover followed by the spacer are removed 30215.

On the uncovered surface of the component, a layer of thermal agent 30216 is then deposited, the depth of this layer corresponding to the height of the spacer, in this instance 0.2 mm.

The exchanger cover is repositioned over the component 30217, the layer of thermal agent being inserted between these two elements. The 4 check screws fixed into the exchanger cover hold it at the desired distance from the component (0.2 mm in this example).

A second screwing of the 4 screws which had previously been removed is then carried out 30218. This second screwing is tighter than the first screwing.

The invention claimed is:

1. A device for cooling an electronic circuit board comprising at least one component covered with an exchanger cover, the device comprising: a heat sink covering all or some of the electronic circuit board; and at least one heat pipe per each component of the at least one component, each heat pipe of the at least one heat pipe being capable of carrying away the heat from the each component with which it is associated to at least one end of the electronic circuit board via a condensing zone of said each heat pipe, said device further comprising at least one heat exchange part located on said end of the electronic circuit board and mounted on the heat sink, the each heat pipe being attached to the at least one heat exchange part by means of the condensing zone of said each heat pipe, wherein the at least one heat-exchange part is mounted on the heat sink with use of pads.

2. The device as claimed in claim 1, wherein each heat exchange part of the at least one heat exchange part covers a portion of the heat sink to form a heat slide capable of being inserted into a guide rail mounted on a frame external to the electronic circuit board.

3. The device as claimed in claim 2, wherein the heat slide includes a locking system, and the locking system is mounted on the heat slide, the locking system being divided into at least one fixed portion and at least one movable portion, said the fixed portion being formed from the heat sink.

4. The device as claimed in claim 1, wherein the each component is associated with at least two heat pipes of the at least one heat pipe distributed on either side of said each component.

5. The device as claimed in claim 1, wherein the each component is associated with at least two heat pipes of the at least one heat pipe placed on the same side of said each component.

6. The device as claimed in claim 5, wherein the at least two heat pipes associated with the each component are oriented in two opposite directions on a first axis.

7. The device as claimed in claim 6, wherein the at least two heat pipes associated with the each component each comprise an L-shaped deformation, one branch of the L-shaped deformation being substantially parallel to the end of the electronic circuit board where the at least one heat-exchange part is located, a curve of the L-shaped deformation of the each heat pipe being oriented in two opposite directions on a second axis, the second axis being parallel to said end of the electronic circuit board.

8. The device as claimed in claim 6, wherein the at least two heat pipes are associated with the each component, and each of the at least two heat pipes comprises a U-shaped deformation, the branches of the U-shaped deformation of each of the at least two heat pipes being substantially parallel to the end of the electronic circuit board where the at least one heat exchange part is located, the U-shaped deformation of a first heat pipe of the at least two heat pipes being oriented in two opposite directions on a second axis, the second axis being parallel to said end of the electronic circuit board.

9. The device as claimed in claim 1, wherein the exchanger cover is attached to the heat sink with one or more screws, and the exchanger cover is held at a chosen and fixed distance from the each component with which it is associated with one or more check screws.

10. An electronic circuit incorporating an electronic circuit board associated with a device as claimed in claim 1.

11. A method for fabricating a cooling device as claimed in claim 1, said method comprising: a step of fabricating the heat sink; a step of fabricating the at least one heat pipes, independent of the step of fabricating the heat sink; and a step of integrating the cooling device into an electronic circuit comprising an attachment of the heat sink to the electronic circuit board and an assembly of the heat sink, the at least one heat pipe and the exchanger cover, wherein the assembly of the heat sink, the at least one heat pipes and the protective caps comprises, for the each component of said assembly, a mounting of the exchanger cover of the each component onto the heat sink, the mounting comprising, for the each component:

a placement of a spacer on said each component, the spacer having a chosen and fixed height corresponding to a distance at which the exchanger cover is held away from the each component;

a first placement of the exchanger cover onto the each component, the spacer being inserted between the each component and the corresponding exchanger cover;

a first screwing of screws, said screws passing through the exchanger cover and a portion of a thickness of the heat sink;

a screwing of check screws, said check screws passing through the exchanger cover and resting on the heat sink;

an unscrewing of the screws and then a removal of the exchanger cover and of the spacer;

a deposition of a layer of thermal agent over the each component, a second placement of the exchanger cover over the each component, the thermal agent being inserted between the each component and the exchanger cover; and a second screwing of the screws, tighter than the first screwing, the check screws holding the exchanger cover at said chosen and fixed height corresponding to the distance from the each component.

\* \* \* \* \*